US012681090B2

(12) United States Patent
Sodani et al.

(10) Patent No.: US 12,681,090 B2
(45) Date of Patent: Jul. 14, 2026

(54) DETERMINING THE BATTERY CONDITION OF A MOBILE ELECTRONIC DEVICE

(71) Applicant: BLANCCO TECHNOLOGY GROUP IP OY, Joensuu (FI)

(72) Inventors: Sourabh Sodani, Maharashtra (IN); Omkar Zunjurke, Maharashtra (IN)

(73) Assignee: BLANCCO TECHNOLOGY GROUP IP OY, Joensuu (FI)

( * ) Notice: Subject to any disclaimer, the term of this patent is extended or adjusted under 35 U.S.C. 154(b) by 545 days.

(21) Appl. No.: 18/020,361

(22) PCT Filed: Aug. 11, 2020

(86) PCT No.: PCT/EP2020/072552
§ 371 (c)(1),
(2) Date: Feb. 8, 2023

(87) PCT Pub. No.: WO2022/033668
PCT Pub. Date: Feb. 17, 2022

(65) Prior Publication Data
US 2023/0273260 A1 Aug. 31, 2023

(51) Int. Cl.
*G01R 31/367* (2019.01)
*G01R 31/371* (2019.01)
*G01R 31/392* (2019.01)

(52) U.S. Cl.
CPC ......... *G01R 31/367* (2019.01); *G01R 31/371* (2019.01); *G01R 31/392* (2019.01)

(58) Field of Classification Search
CPC .. G01R 31/367; G01R 31/371; G01R 31/392; H01M 10/48; H01M 10/488;
(Continued)

(56) References Cited

U.S. PATENT DOCUMENTS

2007/0170893 A1 7/2007 Kao et al.
2013/0249479 A1* 9/2013 Partovi .................. H02J 50/60
320/108
(Continued)

FOREIGN PATENT DOCUMENTS

EP 2075590 7/2009
JP H10163954 6/1998
(Continued)

OTHER PUBLICATIONS

Japanese Office Action / Notice of Reasons for Refusal dated May 29, 2024 (May 29, 2024), 11 pages, issued on related Japanese Patent Application 2023-509779 by the Japanese Patent Office.
(Continued)

*Primary Examiner* — Tung S Lau
(74) *Attorney, Agent, or Firm* — DICKINSON WRIGHT PLLC

(57) ABSTRACT

A method for use in determining a condition of a battery of a mobile electronic device, comprises receiving, at a server, mobile electronic device data from a mobile electronic device, receiving, at the server, information relating to each candidate method of a plurality of candidate methods, each candidate method being configured for determining a value of a corresponding battery condition, wherein the battery condition value corresponding to each candidate method is representative of the condition of the battery of the mobile electronic device. The method further comprises determining whether any of the candidate methods are capable of determining a corresponding battery condition value based at least in part on the mobile electronic device data and the information relating to each candidate method, and, in response to determining that one or more of the candidate methods is capable of determining one or more corresponding battery condition values, performing one or more of the capable methods to thereby determine the one or more
(Continued)

corresponding battery condition values. The method may be suitable for use in determining a condition of a battery of a mobile electronic device and, in particular though not exclusively, for use in determining a condition of a battery of a mobile electronic device which comprises or runs an Android operating system.

23 Claims, 8 Drawing Sheets

(58) Field of Classification Search
CPC ....... H01M 2010/4278; H01M 2220/30; H02J 7/005; Y02D 10/00; Y02E 60/10; G06F 1/3212; G06F 1/28
See application file for complete search history.

(56) References Cited

U.S. PATENT DOCUMENTS

| | | | |
|---|---|---|---|
| 2014/0330764 | A1 | 11/2014 | Rhines et al. |
| 2015/0351037 | A1 | 12/2015 | Brown et al. |
| 2016/0349330 | A1* | 12/2016 | Barfield, Jr. ......... G01R 31/389 |
| 2020/0090425 | A1* | 3/2020 | Senft-Grupp ...... G01R 31/3648 |
| 2020/0174081 | A1 | 6/2020 | Du et al. |

FOREIGN PATENT DOCUMENTS

| | | |
|---|---|---|
| JP | 2014180126 | 9/2014 |
| WO | 2015183459 | 12/2015 |
| WO | 2019185701 | 10/2019 |

OTHER PUBLICATIONS

Notification Concerning Transmittal of International Preliminary Report on Patentability (Chapter 1 of the Patent Cooperation Treatly) dated Feb. 23, 2023 (Feb. 23, 2023) issued on related international patent application PCT/EP2020/072552 by the International Bureau of WIPO.
Notice of Reasons for Refusal / Japanese Office Action dated Nov. 7, 2024 (Nov. 7, 2024), 9 pages, issued on related Japanese Patent Application JP 2023-509779, by the Japanese Patent Office.

* cited by examiner

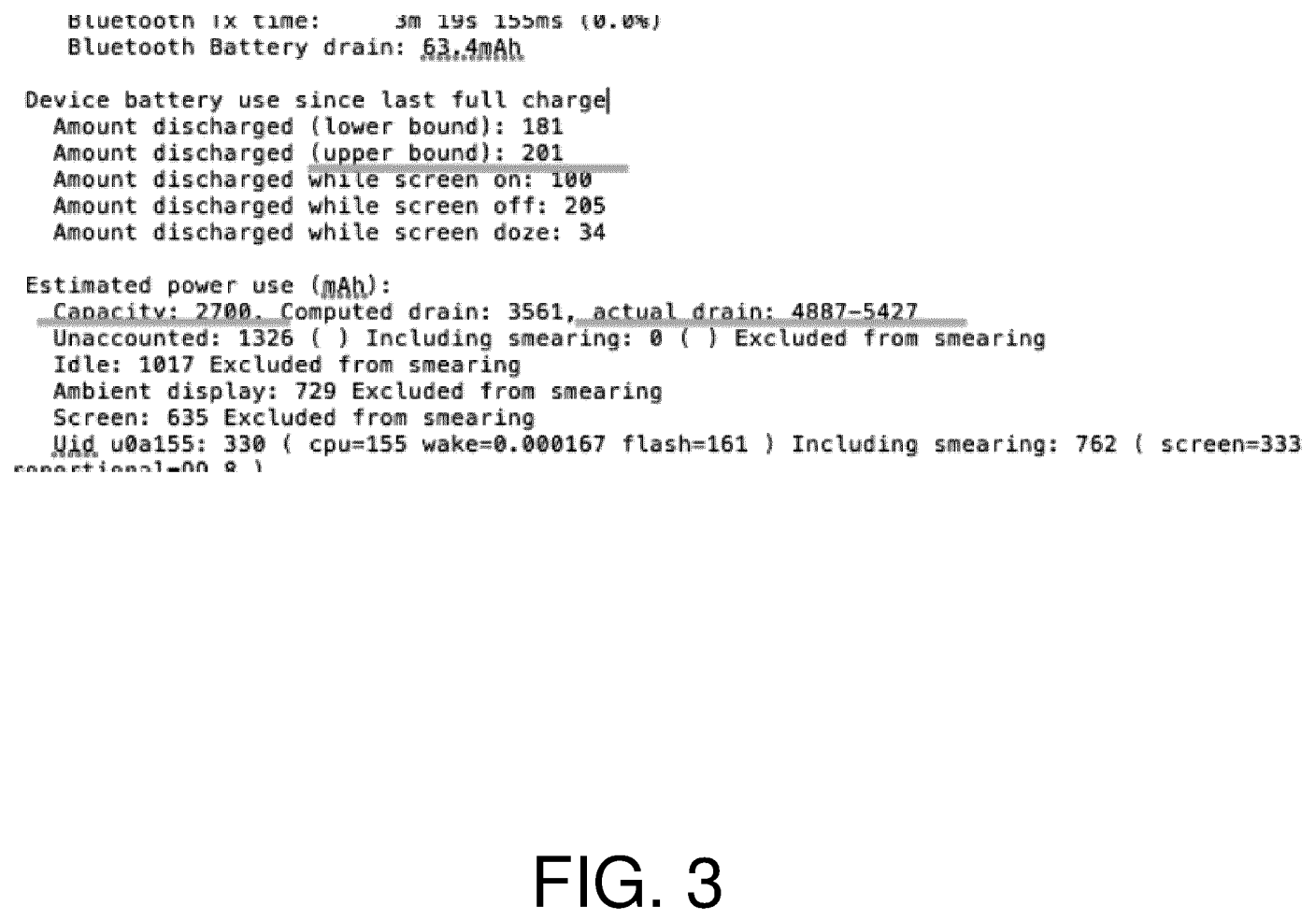

```
Bluetooth Ix time:       3m 19s 155ms (0.0%)
Bluetooth Battery drain: 63.4mAh Device battery use since last full charge|
  Amount discharged (lower bound): 181
  Amount discharged (upper bound): 201
  Amount discharged while screen on: 100
  Amount discharged while screen off: 205
  Amount discharged while screen doze: 34

Estimated power use (mAh):
  Capacity: 2700, Computed drain: 3561, actual drain: 4887-5427
  Unaccounted: 1326 ( ) Including smearing: 0 ( ) Excluded from smearing
  Idle: 1017 Excluded from smearing
  Ambient display: 729 Excluded from smearing
  Screen: 635 Excluded from smearing
  Uid u0a155: 330 ( cpu=155 wake=0.000167 flash=161 ) Including smearing: 762 ( screen=333
```

FIG. 3

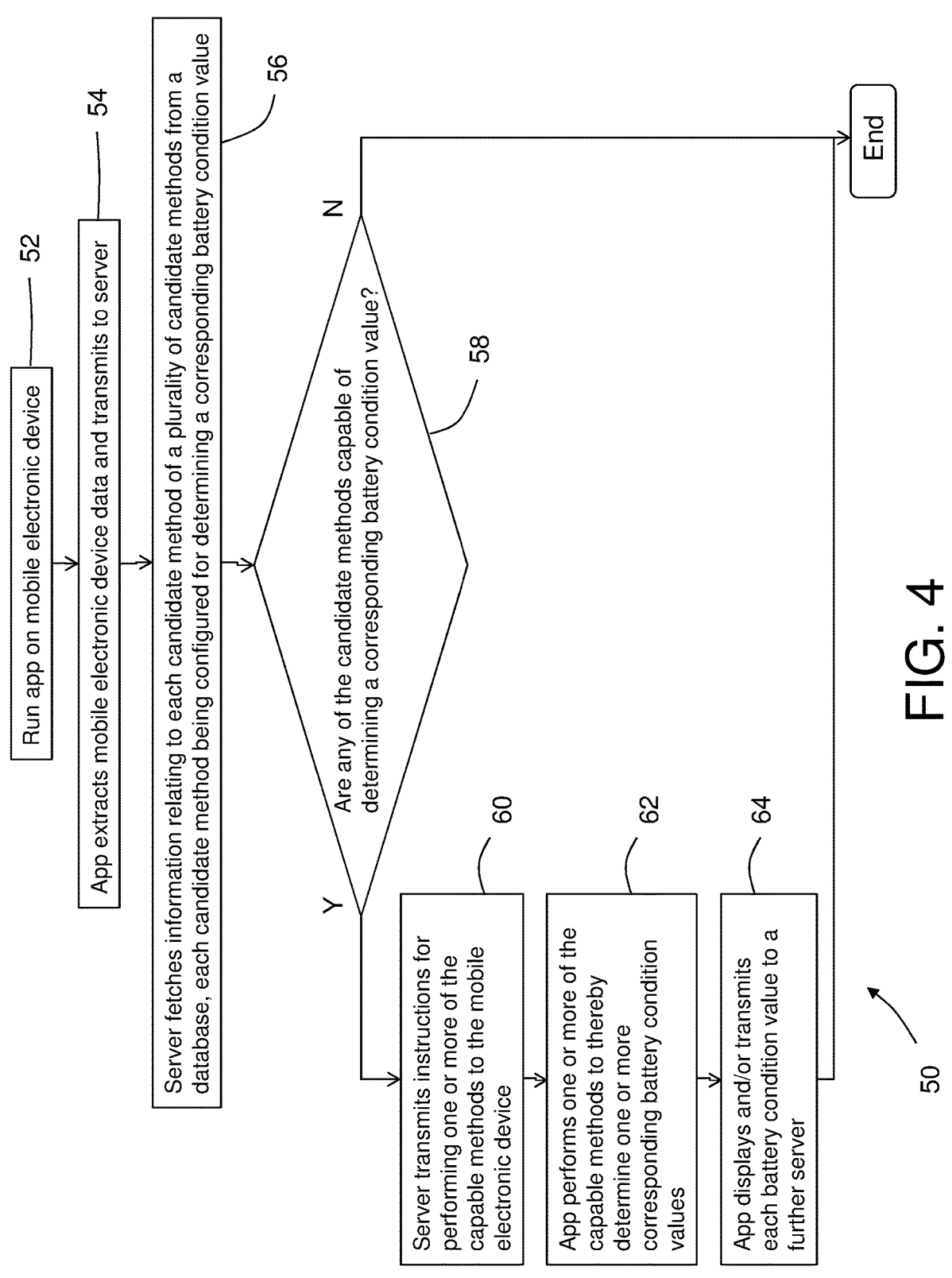

Run app on mobile electronic device — 52

App extracts mobile electronic device data and transmits to server — 54

Server fetches information relating to each candidate method of a plurality of candidate methods from a database, each candidate method being configured for determining a corresponding battery condition value — 56

Are any of the candidate methods capable of determining a corresponding battery condition value? — 58

N → End

Y

Server transmits instructions for performing one or more of the capable methods to the mobile electronic device — 60

App performs one or more of the capable methods to thereby determine one or more corresponding battery condition values — 62

App displays and/or transmits each battery condition value to a further server — 64

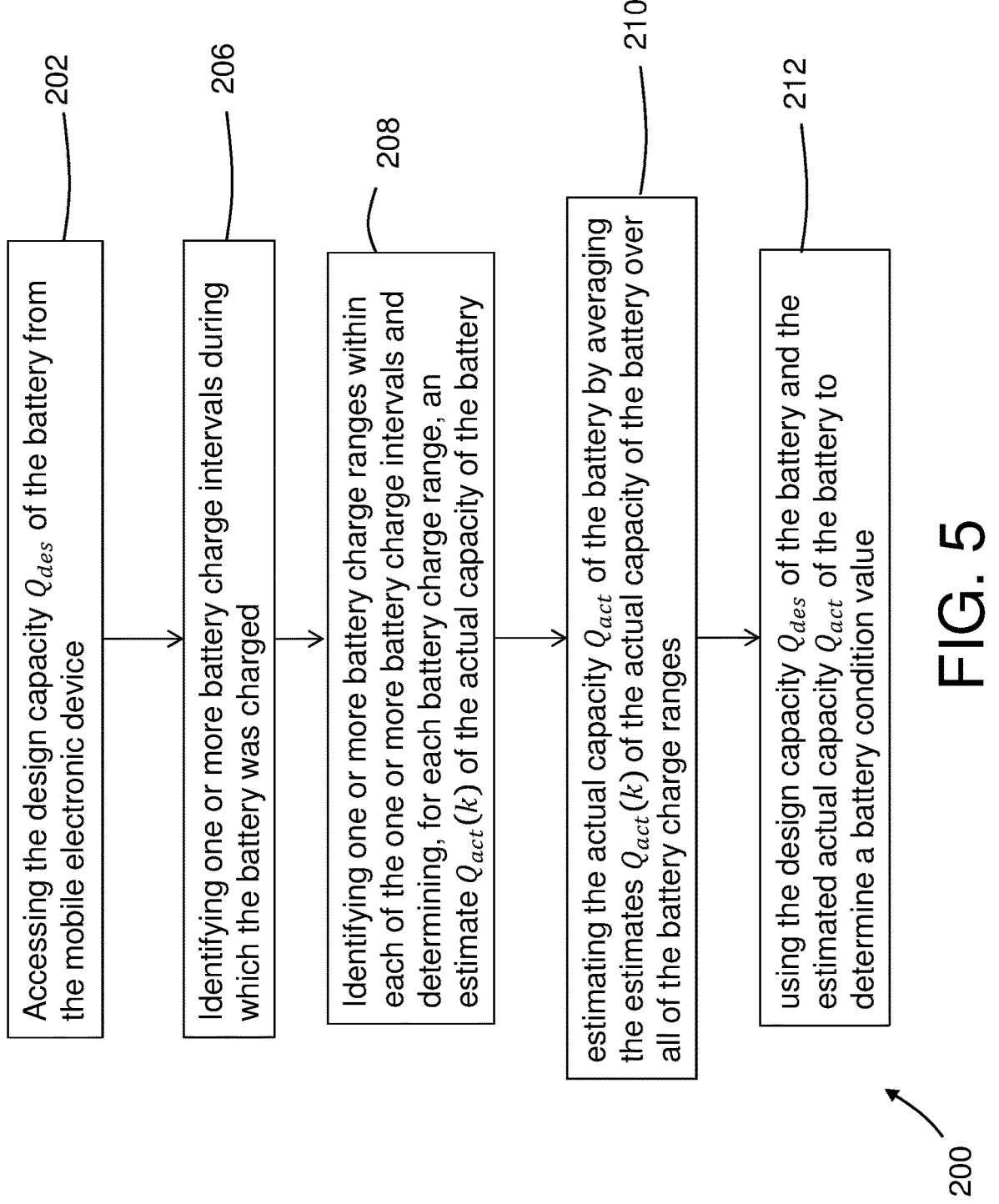

Accessing the design capacity $Q_{des}$ of the battery from the mobile electronic device — 202

Identifying one or more battery charge intervals during which the battery was charged — 206

Identifying one or more battery charge ranges within each of the one or more battery charge intervals and determining, for each battery charge range, an estimate $Q_{act}(k)$ of the actual capacity of the battery — 208 estimating the actual capacity $Q_{act}$ of the battery by averaging the estimates $Q_{act}(k)$ of the actual capacity of the battery over all of the battery charge ranges — 210 using the design capacity $Q_{des}$ of the battery and the estimated actual capacity $Q_{act}$ of the battery to determine a battery condition value — 212

```
Start

Battery_life_cal_method is final name of battery life calculation method name :

Battery_life_threshold is threshold for selected method :

If (Device has BatteryCycle)
  {
    Battery_life_cal_method= Battery_Life_Using_Cycle_method;

Battery_life_threshold=Cycle_threshold;
  }

Else if(Device has BatteryCurrentInfo)
  {
    Battery_life_cal_method=Battery_life_Using_Charge_Method;

Battery_life_threshold=Charge_threshold;
  }

Else if(Device has BatteryDrainLog)
  {
    Battery_life_cal_method=Battery_life_Using_Drain_Method;

Battery_life_threshold=Drain_threshold
  }

Battery_Profile =[Battery_life_cal_method, Battery_life_threshold];

Send_Back_To_Device(Battery_Profile);

End
```

FIG. 8A

```
Start

If(Battery_Cycle >= cycle_threshold)
  {
    Battery_Life = Bad
  }
  else
  {
    Battery_Life=Good
  }
```

FIG. 8B

DETERMINING THE BATTERY CONDITION OF A MOBILE ELECTRONIC DEVICE

CROSS REFERENCE TO RELATED APPLICATIONS

This application is a U.S. National Phase patent application of and claims priority to PCT/EP2020/072552, filed Aug. 11, 2020, the foregoing application is being incorporated herein by reference.

FIELD

The present disclosure relates to a method and system for use in determining a condition of a battery of a mobile electronic device and, in particular though not exclusively, for use in determining a condition of a battery of a mobile electronic device which comprises or runs an Android operating system. The present disclosure also relates to a server, a computer program and an app associated with the method and the system.

BACKGROUND

Mobile devices are typically powered by an electrochemical battery wherein two metallic electrodes are sealed inside a volume filled with an electrolyte that enables charge carriers to move between the electrodes. When the battery is charged and discharged, it is prone to wear down due to unwanted chemical reactions, physical wear and drying-up of the electrolyte, for example. This wearing down is a gradual process, which might go unnoticed by the user of the mobile device until the battery is already at the end of its life cycle. It would therefore be an advantage if a person purchasing a second-hand mobile device, for example, were able to reliably estimate the life-expectancy of the battery of the second-hand mobile device.

It is known to estimate a life-expectancy of a battery of a mobile electronic device based on a condition of the battery of the mobile electronic device. It is also known to estimate the battery condition of the mobile electronic device by using a dedicated app on the mobile electronic device to collect new battery performance battery data while the battery is being drained and charged in everyday use and then estimating the battery condition of the mobile electronic device from the collected battery performance data.

However, there is no single "quick" method for estimating battery condition that is suitable for all different types of mobile electronic devices and which does not require the execution of a dedicated app on the mobile electronic device to collect battery performance data.

SUMMARY

It should be understood that any one or more of the features of any one of the following aspects may be combined with any one or more of the features of any of the other following aspects.

According to at least one aspect of the present disclosure there is provided a method for use in determining a condition of a battery of a mobile electronic device, the method comprising:

receiving, at a server, mobile electronic device data from a mobile electronic device;

receiving, at the server, information relating to each candidate method of a plurality of candidate methods, each candidate method being configured for determining a value of a corresponding battery condition, wherein the battery condition value corresponding to each candidate method is representative of the condition of the battery of the mobile electronic device;

determining whether any of the candidate methods are capable of determining a corresponding battery condition value based at least in part on the mobile electronic device data and the information relating to each candidate method; and in response to determining that one or more of the candidate methods is capable of determining one or more corresponding battery condition values, performing the one or more of the capable methods to thereby determine the one or more corresponding battery condition values.

Such a method may enable a condition of the battery of the mobile electronic device to be determined without requiring a new set of battery performance data to be collected or measured, for example using a dedicated app.

The mobile electronic device data may comprise at least one of a make, a model, an operating system (OS), and a version of the OS of the mobile electronic device.

The battery data stored on, and readily available from, any mobile electronic device may depend on at least one of a make, model, an OS, and a version of the OS of the mobile electronic device. Hence, providing the server with at least one of the make, model, OS and OS version of the mobile electronic device, may allow the server to determine the sort of battery data that is stored on, and readily available from, the mobile electronic device.

The method may provide the most accurate results for the condition of the battery of the mobile electronic device by selecting and executing an optimum or appropriate method for determining the condition of the battery of the mobile electronic device, which method may be specific to the make, model, OS, and OS version of the mobile electronic device.

The mobile electronic device may comprise or run an Android operating system such as Android Marshmallow Versions 6.0-6.0.1, Android Nougat Versions 7.0-7.1.2, Android Oreo Versions 8.0-8.1 or Android P Version 9.

The mobile electronic device data may comprise data relating to the battery of the mobile electronic device.

The mobile electronic device data may comprise a design capacity $Q_{des}$ of the battery.

The mobile electronic device data may comprise a make and/or a model of the battery of the mobile electronic device.

The mobile electronic device data may comprise historical battery performance data. The historical battery performance data may be readily available on the mobile electronic device.

The method may comprise extracting the mobile electronic device data from data stored at the mobile electronic device.

The method may comprise extracting historical battery performance data from data stored on the mobile electronic device.

The method may comprise extracting the historical battery performance data from a battery cycle information file stored on the mobile electronic device.

The method may comprise extracting the historical battery performance data from a battery stats log file stored on the mobile electronic device.

The battery stats log file may be output from a battery stats service of a dumpsys tool that runs on the mobile electronic device.

The method may comprise running an app on the mobile electronic device to extract the mobile electronic device data from data stored at the mobile electronic device.

The app may extract the mobile electronic device data via application programming interfaces (APIs).

The method may comprise transmitting the mobile electronic device data from the mobile electronic device to the server.

The method may comprise running an app on the mobile electronic device to transmit the mobile electronic device data from the mobile electronic device to the server.

The information relating to each candidate method may comprise a set of instructions for performing each candidate method.

Performing one or more of the capable methods may comprise executing the corresponding set of instructions for performing each one or more of the capable methods.

The information relating to each candidate method may comprise an indication of a type of each candidate method or an indication of a type of one or more input parameters associated with each candidate method.

The method may comprise receiving a set of instructions for performing each of the capable methods based at least in part on the mobile electronic device data and the indication of the type of each capable method or based at least in part on the mobile electronic device data and the indication of the type of the one or more input parameters associated with each capable method. Such a method may require that the server only receives a set of instructions for performing each of the capable methods and may avoid any requirement for the server to receive a set of instructions for performing all of the candidate methods.

The information relating to each candidate method may comprise a corresponding battery condition threshold value. The method may comprise comparing each determined battery condition value with the corresponding battery condition threshold value. The method may comprise determining whether the battery condition is compliant or non-compliant with a predetermined battery condition test according to the result of the comparison.

The battery condition values determined using two or more of the candidate methods may relate to different quantities which are each representative of the condition of the battery of the mobile electronic device.

One or more of the battery condition values may comprise:

a battery cycle count value of the battery;

a ratio of a present or actual charge capacity of the battery to a design charge capacity of the battery expressed as a percentage or as a fractional value;

a proportion of a life-time of the battery which remains expressed as a percentage or as a fractional value;

a proportion of a life-time of the battery which has elapsed expressed as a percentage or as a fractional value; or a present or actual wear value of the battery expressed as a percentage or as a fractional value.

The method may comprise:

transmitting, from the server to the mobile electronic device, instructions for performing each one or more of the capable methods; and executing, at the mobile electronic device, the instructions for performing each one or more of the capable methods.

The method may comprise transmitting, from the mobile electronic device to the server, each determined battery condition value.

The method may comprise transmitting, from the mobile electronic device to a further server, each determined battery condition value. The further server may, for example, store each determined battery condition value for the electronic mobile device and one or more determined battery condition values for one or more other electronic mobile device. The further server may, for example, comprise a reports server or the like.

The method may comprise:

executing, at the server, instructions for performing each one or more of the capable methods; and transmitting, from the server to the mobile electronic device, the one or more corresponding determined battery condition values.

The method may comprise:

executing some of the instructions for performing each one or more of the capable methods at the server; and executing some of the instructions for performing each one or more of the capable methods at the mobile electronic device.

The method may comprise selecting an optimum one of the one or more capable methods based at least in part on the mobile electronic device data and the information relating to each candidate method and performing the optimum method to thereby determine a corresponding battery condition value, wherein the battery condition value determined using the optimum one of the one or more capable methods is known to provide a more accurate representation of the condition of the battery of the mobile electronic device than the battery condition value determined using any other one of the capable methods.

The method may comprise:

transmitting, from the server to the mobile electronic device, instructions for performing the optimum one of the one or more capable methods; and executing, at the mobile electronic device, the instructions for performing the optimum one of the one or more capable methods.

Receiving information relating to each candidate method of a plurality of candidate methods may comprise storing the information relating to each candidate method at the server.

Receiving information relating to each candidate method of a plurality of candidate methods may comprise fetching the information relating to each candidate method from a database to the server.

The method may comprise updating or modifying the information in the database relating to one or more of the candidate methods. Updating or modifying the information in the database relating to one or more of the candidate methods may enable an improvement in the accuracy of the determined battery condition.

The method may comprise storing, in the database, information relating to one or more additional candidate methods, each additional candidate method being configured for determining a corresponding battery condition value, wherein the battery condition value corresponding to each candidate method is representative of the condition of the battery of the mobile electronic device. Such a method may enable an improvement in the accuracy of the estimate of the determined battery condition by enabling input of the one or more additional candidate methods, each additional candidate method being configured for determining a value of a corresponding battery condition.

The information relating to the one or more additional candidate methods may comprise instructions for performing the one or more additional candidate methods.

The method may comprise making each determined battery condition value available at the mobile electronic device.

The method may comprise displaying, at the mobile electronic device, each determined battery condition value.

The historical battery performance data may comprise a battery cycle count value representing the number of full discharge/charge cycles associated with the battery of the mobile electronic device. The method may comprise returning the battery cycle count value as at least one of the determined battery condition values.

The historical battery performance data may comprise historical battery charge data. The method may comprise determining one or more of the battery condition values based at least in part on the historical battery charge data.

The historical battery charge data may comprise time information and battery charging status information.

The method may comprise using the time information and the battery charging status information to identify one or more battery charge intervals during which the battery was charged.

The historical battery charge data may comprise a plurality of historical battery charge data points for each battery charge interval, wherein each historical battery charge data point comprises time information, battery charging current information, and battery charge information, The time information may comprise a relative time value or time stamp.

The battery charging current information may comprise a value of charging current supplied to the battery.

The battery charge information may comprise a fractional value of the present or actual capacity $Q_{act}$ of the battery, expressed as a fraction or as a percentage of the present or actual capacity $Q_{act}$ of the battery.

The method may comprise identifying one or more battery charge ranges within each of the one or more battery charge intervals.

The method may comprise determining, for each battery charge range, an estimate $Q_{act}(k)$ of the present or actual charge capacity $Q_{act}$ of the battery, where k is an index assigned to each battery charge range according to the numerical order in which the fractional values of the present or actual capacity $Q_{act}$ of the battery in the battery charge ranges occur.

The method may comprise estimating the present or actual capacity $Q_{act}$ of the battery by averaging the estimates $Q_{act}(k)$ of the present or actual capacity of the battery for all of the battery charge ranges according to the formula:

$$Q_{act} = \frac{1}{N_k}\sum_{\forall k} Q_{act}(k)$$

where $N_k$ is the total number of battery charge ranges.

The method may comprise determining one or more of the battery condition values based at least in part on the present or actual capacity $Q_{act}$ of the battery.

The method may comprise returning one or more of the following quantities as one or more of the battery condition values: the ratio $Q_{act}/Q_{des}$; the percentage $100\times Q_{act}/Q_{des}$; a percentage wear value $W_p$ determined according to $W_p=100\times(1-Q_{act}/Q_{des})$; and a fractional wear value $W_f$ determined according to: $W_f=1-Q_{act}/Q_{des}$.

The historical battery performance data may comprise historical battery drain data. The method may comprise determining one or more of the battery condition values based at least in part on the historical battery drain data.

The historical battery drain data may comprise a lower limit min($\Sigma\Delta Q$) for a cumulative charge consumed over a drain period, an upper limit max($\Sigma\Delta Q$) for the cumulative charge consumed over the drain period. The lower limit min($\Sigma\Delta Q$) for the cumulative charge consumed over the drain period may be a lower limit of an actual drain parameter extracted from a battery stats log file and the upper limit max($\Sigma\Delta$) for the cumulative charge consumed over the drain period may be an upper limit of the actual drain parameter extracted from the battery stats log file. The drain period may be defined as a time period elapsed since the last full charge of the battery of the mobile electronic device.

The method may comprise determining an average value avg($\Sigma\Delta Q$) for the cumulative charge consumed over the drain period according to $$avg\left(\sum\Delta Q\right) = \frac{1}{2}\left[\min\left(\sum\Delta Q\right) + \max\left(\sum Q\Delta\right)\right].$$

The historical battery drain data may comprise a cumulative percentage drop in charge $\Sigma\Delta p$ over the drain period and the method may comprise determining an actual capacity $Q_{act}$ of the battery according to $Q_{act}=avg(\Sigma\Delta Q)\times 100/\Sigma\Delta p$.

The cumulative percentage drop in charge $\Sigma\Delta p$ over the drain period may be the upper bound parameter extracted from a battery stats log file.

The historical battery drain data may comprise a cumulative fractional drop in charge $\Sigma\Delta f$ over the drain period and the method may comprise determining an actual capacity $Q_{act}$ of the battery according to $Q_{act}=avg(\Sigma\Delta Q)/\Sigma\Delta f$.

The method may comprise determining one or more of the battery condition values based at least in part on the present or actual capacity $Q_{act}$ of the battery.

The method may comprise returning one or more of the following quantities as one or more of the battery condition values: the ratio $Q_{act}/Q_{des}$; the percentage $100\times Q_{act}/Q_{des}$; a percentage wear value $W_p$ determined according to $W_p=100\times(1-Q_{act}/Q_{des})$; and a fractional wear value $W_f$ determined according to $W_f=1-Q_{act}/Q_{des}$.

According to at least one aspect of the present disclosure there is provided an app which, when executed on a mobile electronic device, causes a method to be performed as described above.

According to at least one aspect of the present disclosure there are provided instructions for a server for use in determining a condition of a battery of a mobile electronic device, which instructions, when executed by a processing resource of the server, cause the server to:

receive mobile electronic device data from the mobile electronic device;

receive information relating to each candidate method of a plurality of candidate methods, each candidate method being configured for determining a value of a corresponding battery condition, wherein the battery condition value corresponding to each candidate method is representative of the condition of the battery of the mobile electronic device;

determine whether any of the candidate methods are capable of determining a corresponding battery condition value based at least in part on the mobile electronic device data and the information relating to each candidate method; and in response to determining that one or more of the candidate methods is capable of determining one or more corresponding battery condition values, cause the one or more of the capable methods to be performed to thereby determine the one or more corresponding battery condition values.

According to at least one aspect of the present disclosure there is provided a server for use in determining a condition of a battery of a mobile electronic device, the server comprising a processing resource and a memory containing instructions which, when executed by the processing resource, cause the processing resource to:

receive mobile electronic device data from the mobile electronic device;

receive information relating to each candidate method of a plurality of candidate methods, each candidate method being configured for determining a value of a corresponding battery condition, wherein the battery condition value corresponding to each candidate method is representative of the condition of the battery of the mobile electronic device;

determine whether any of the candidate methods are capable of determining a corresponding battery condition value based at least in part on the mobile electronic device data and the information relating to each candidate method; and in response to determining that one or more of the candidate methods is capable of determining one or more corresponding battery condition values, cause the one or more of the capable methods to be performed to thereby determine the one or more corresponding battery condition values.

According to at least one aspect of the present disclosure there is provided a system comprising the server and a database storing the information relating to each candidate method of the plurality of candidate methods, wherein, when executed by the processing resource of the server, the instructions cause the processing resource of the server to fetch the information relating to each candidate method of the plurality of candidate methods from the database.

It should be understood that any one or more of the features of any one of the foregoing aspects may be combined with any one or more of the features of any of the other foregoing aspects.

BRIEF DESCRIPTION OF THE DRAWINGS

A method and system for use in determining a condition of a battery of a mobile electronic device will now be described by way of non-limiting example only with reference to the following drawings of which:

FIG. 3 is a generic example of historical battery drain data stored in a battery stats log file of the mobile electronic device of FIG. 1;

FIG. 4 is a flow chart illustrating a method for use in determining a condition of the battery of the mobile electronic device of FIG. 1;

FIG. 5 shows a method for determining a battery condition value of the mobile electronic device of FIG. 1 using historical battery charge data;

FIG. 8A shows pseudo code instructions for selecting an optimum method for use in determining a condition of the battery of the mobile electronic device of FIG. 1; and FIG. 8B shows pseudo code instructions for comparing determined battery condition values with corresponding battery condition threshold values and determining whether the battery condition is compliant or non-compliant with a predetermined battery condition test.

DETAILED DESCRIPTION OF THE DRAWINGS

One of ordinary skill in the art will understand that one or more of the features of the embodiments described below with reference to the drawings may produce effects or provide advantages when used in isolation from one or more of the other features of the embodiments and that different combinations of the features are possible other than the specific combinations of the features of the embodiments described below.

Figure 1:
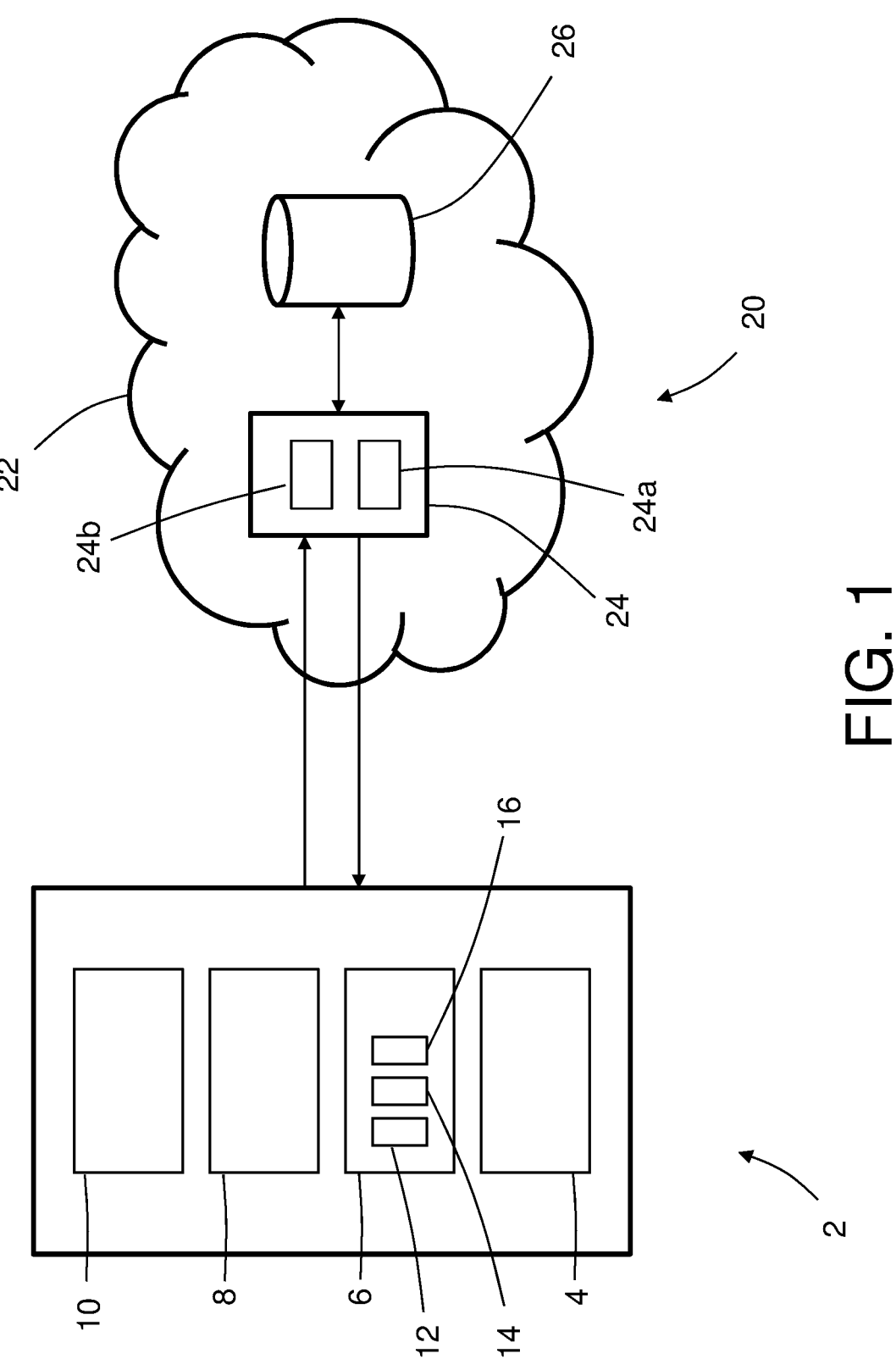
FIG. 1 is a schematic of a mobile electronic device and a system for use in determining a condition of a battery of the mobile electronic device.

Referring initially to FIG. 1 there is shown a mobile electronic device generally designated 2 and a system generally designated 20 for use in determining a condition of a battery of the mobile electronic device 2.

The mobile electronic device 2 includes the battery 4, a memory 6, a processing resource 8, and a user interface 10. The memory 6 stores an operating system in the form of an Android operating system 12 and mobile electronic device data 14. The mobile electronic device data 14 includes at least one of a make, a model, and a version of the Android operating system 12 of the mobile electronic device 2. The mobile electronic device data further includes data relating to the battery 4 of the mobile electronic device 2. Specifically, the mobile electronic device data 14 further includes historical battery performance data for the battery 4 of the mobile electronic device 2 in the form of a battery cycle information file and a battery stats log file stored in the memory 6 of the mobile electronic device 2. The battery stats log file may be output from a batterystats service of a dumpsys tool that runs on the mobile electronic device 2. The mobile electronic device data 14 may further include a make and/or a model of the battery 4 of the mobile electronic device 2.

The battery cycle information file includes a battery cycle count value representing the number of full discharge/charge cycles associated with the battery 4.

Figure 2:
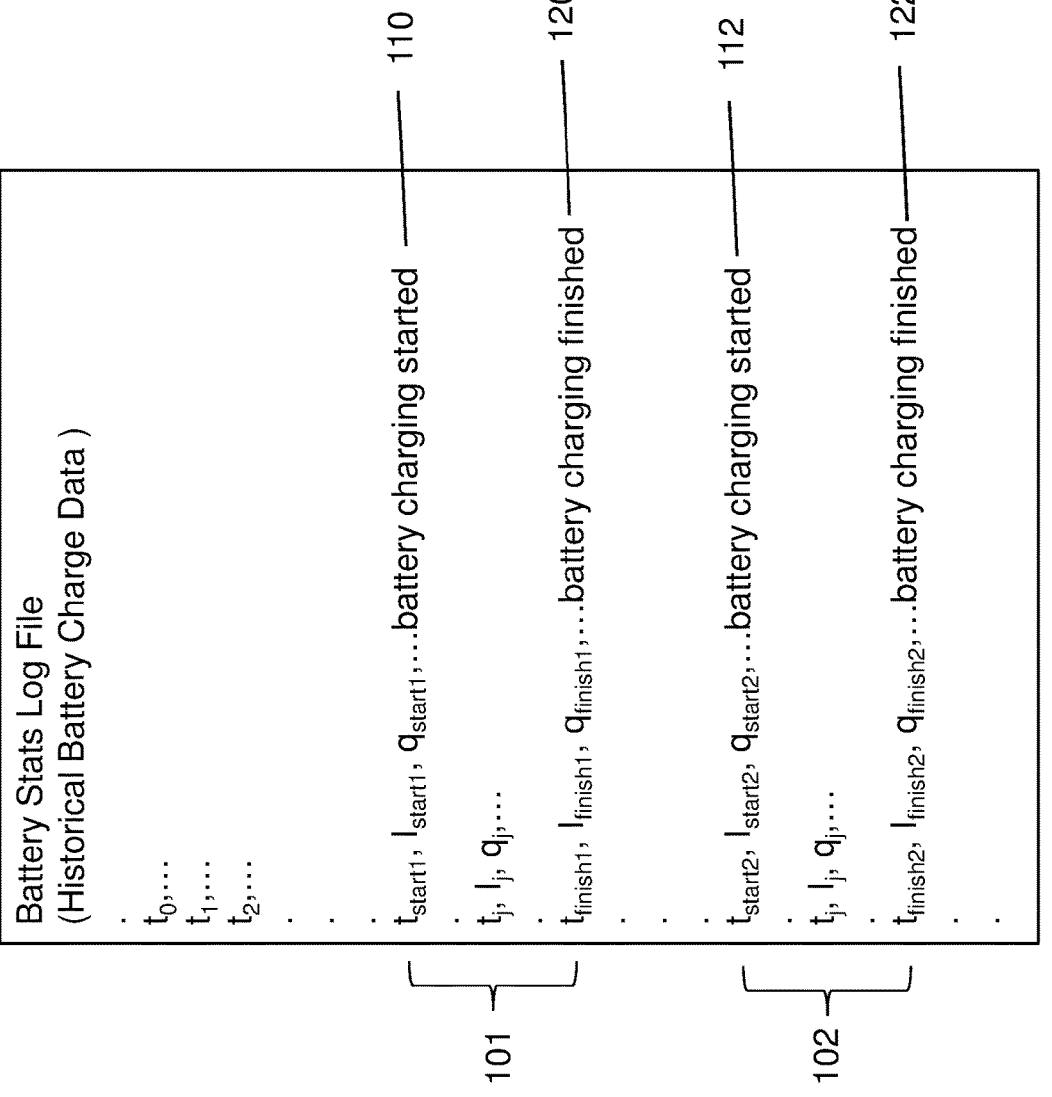
FIG. 2 is a generic example of historical battery charge data stored in a battery stats log file of the mobile electronic device of FIG. 1.

FIG. 2 illustrates the format of the battery stats log file which includes historical battery charge data in the form of a first set of historical battery charge data points corresponding to a first battery charge interval 101 and a second set of historical battery charge data points corresponding to a second battery charge interval 102.

Each historical battery charge data point of the first battery charge interval 101 comprises time information and corresponding battery charging current and battery charge information. The time information takes the form of relative time values or time stamps expressed as a date and a time in hours, minutes and seconds, $t_{start1}, \ldots t_j, \ldots t_{finish1}$. The battery charging current information comprises an absolute value of charging current expressed in mA, $I_{start1}, \ldots I_j, \ldots I_{finish1}$ supplied to the battery at each time $t_{start1}, \ldots$ $t_j$, . . . $t_{finish1}$ respectively. The battery charge information comprises a fractional value $q_{start1}$, . . . $q_i$, . . . $q_{finish1}$ of the actual charge capacity $Q_{act}$ of the battery expressed as a fraction or percentage of the actual charge capacity $Q_{act}$ of the battery at each time $t_{start1}$, . . . $t_{finish1}$ respectively.

Similarly, each historical battery charge data point of the second battery charge interval 102 comprises time information and corresponding battery charging current and battery charge information. The time information takes the form of relative time values or time stamps expressed as a date and a time in hours, minutes and seconds, $t_{start2}$, . . . $t_j$, . . . $t_{finish2}$. The battery charging current information comprises an absolute value of charging current expressed in mA, $I_{start2}$, . . . $I_j$, $I_{finish2}$ supplied to the battery at each time $t_{start2}$, . . . $t_j$, . . . $t_{finish2}$ respectively. The battery charge information comprises a fractional value $q_{start2}$, . . . $q_i$, . . . $q_{finish2}$ of the actual charge capacity $Q_{act}$ of the battery expressed as a fraction or percentage of the actual charge capacity $Q_{act}$ of the battery at each time $t_{start2}$, . . . $t_j$, . . . $t_{finish2}$ respectively.

The battery stats log file also includes battery charging status information such as a battery charging status flags 110, 112, indicating when battery charging started, and a battery charging status flags 120, 122 indicating when battery charging finished.

One of skill in the art will understand that, an actual battery stats log file may include other information not shown in FIG. 2 or that an actual battery stats log file may present the historical battery charge data in a different format to that shown in FIG. 2.

FIG. 3 illustrates a specific example of a further portion of the battery stats log file which includes the historical battery drain data. Specifically, as shown in FIG. 3, the historical battery drain data includes a value for the design capacity $Q_{des}$ of the battery 4 which is expressed in mAh and which is identified in FIG. 3 using the label "Capacity". For the specific data shown in FIG. 3, the design capacity $Q_{des}$ of the battery 4 is 2700 mAh. The historical battery drain data also includes a range of values for the cumulative charge consumed by the battery 4 over a drain period identified in FIG. 3 using the label "actual drain", wherein the drain period is defined as a time period elapsed since the last full charge of the battery 4. Specifically, the range of values for the cumulative charge consumed by the battery 4 over the drain period includes a lower limit $min(\Sigma\Delta Q)$ expressed in mAh and an upper limit $max(\Sigma\Delta Q)$ expressed in mAh. For the specific data shown in FIG. 3, $min(\Sigma\Delta Q)$=4887 mAh and $max(\Sigma\Delta Q)$=5427 mAh. The historical battery drain data further includes a cumulative percentage drop in charge $\Sigma\Delta p$ over the drain period which is identified in FIG. 3 using the label "Amount discharged (upper bound)", where each percentage drop in charge $\Delta p$ is expressed as a percentage drop in charge relative to a full charge of the battery e.g. if during a drain period, a percentage charge of the battery 4 drops from 100% to 20% (i.e. a percentage drop of 80%), the battery is then charged so that the percentage charge of the battery 4 rises from 20% to 70%, and the percentage charge of the battery 4 then drops from 70% to 30% (i.e. a percentage drop of 40%), then the cumulative percentage drop in charge $\Sigma\Delta p$ over the drain period is 120%. For the specific data shown in FIG. 3, the cumulative percentage drop in charge $\Sigma\Delta p$ over the drain period is 201%.

One of skill in the art will understand that, in general, the historical battery drain data values in the battery stats log file may be different to the specific historical battery drain data values shown in FIG. 3, the battery stats log file may include other information not shown in FIG. 3, and that the battery stats log file may present the historical battery drain data in a different format to that shown in FIG. 3.

Referring back to FIG. 1, the memory 6 also stores an app 16 which is configured to determine a battery condition value which is representative of a condition of the battery 4 of the mobile electronic device 2, as will be described in more detail below.

The system 20 includes a battery profiler cloud 22 which includes a server in the form of a battery profiler server 24 and a database in the form of a battery profiler database 26. The battery profiler server 24 includes a processing resource 24a and a memory 24b containing instructions which, when executed by the processing resource 24a, cause the processing resource 24a to perform various operations as will be described in more detail below. The battery profiler database 26 stores information relating to each candidate method of a plurality of candidate methods, each candidate method being configured for determining a corresponding battery condition value, wherein the battery condition value corresponding to each candidate method is representative of the condition of the battery 4 of the mobile electronic device 2. The battery condition value may, for example, be a battery cycle count value of the battery 4; a ratio of a present or actual charge capacity of the battery 4 to a design charge capacity of the battery 4 expressed as a percentage or as a fractional value; a proportion of a life-time of the battery 4 which remains expressed as a percentage or as a fractional value; a proportion of a life-time of the battery 4 which has elapsed expressed as a percentage or as a fractional value; or a present or actual wear value of the battery 4 expressed as a percentage or as a fractional value. The information relating to each candidate method may include instructions for performing the candidate method and a battery condition threshold value corresponding to the candidate method. The battery profiler server 24 is configured for two-way communication with the mobile electronic device 2 and for two-way communication with the battery profiler database 26.

Referring to FIG. 4 there is shown a method generally designated 50 for use in determining a condition of the battery 4 of the mobile electronic device 2. The method 50 begins at step 52, with a user of the mobile electronic device 2 running the app 16. Running the app 16 causes the app 16 to extract at least some of the mobile electronic device data 14 from the mobile electronic device 2 via one or more application programming interfaces (APIs) and to transmit at least some of the mobile electronic device data 14 from the mobile electronic device 2 to the battery profiler server 24 at step 54. Specifically, at step 54, the app 16 extracts at least one of the make, the model and the version of the Android operating system 12 of the mobile electronic device 2 from the memory 6 of the mobile electronic device 2 and transmits at least one of the make, the model and the operating system of the mobile electronic device 2 to the battery profiler server 24.

At step 56, the method continues with the processing resource 24a of the battery profiler server 24 fetching information relating to each candidate method of the plurality of candidate methods from the battery profiler database 26, each candidate method being configured for determining a corresponding battery condition value. Specifically, the processing resource 24a of the battery profiler server 24 fetches instructions from the battery profiler database 26 for performing each of the candidate methods stored in the battery profiler database 26.

At step 58, the method continues with the processing resource 24a of the battery profiler server 24 determining whether any of the candidate methods are capable of determining a corresponding battery condition value based at least in part on the mobile electronic device data 14 and the information relating to each candidate method. Specifically, the processing resource 24*a* of the battery profiler server 24 identifies a set of input parameters required by the instructions for performing each of the candidate methods stored in the battery profiler database 26 and compares the required set of input parameters for each of the candidate methods with a set of parameter values known to be stored in a memory of any mobile electronic device which has the same make, model and version of the Android operating system as the mobile electronic device 2. If the required set of input parameters for any candidate method matches the set of parameter values known to be stored in a memory of any mobile electronic device having the same make, model and version of the Android operating system as the mobile electronic device 2, then the processing resource 24*a* of the battery profiler server 24 identifies the candidate method concerned as a method which is capable of determining a corresponding battery condition value for the battery 4 of the mobile electronic device 2 based on the historical battery performance data which must be stored in the memory 6 of the mobile electronic device 2. For the specific example of the mobile electronic device 2, the processing resource 24*a* of the battery profiler server 24 uses at least one of the make, model and version of the Android operating system of the mobile electronic device 2 to identify that the memory 6 of the mobile electronic device 2 must have historical battery performance data in the form of a battery cycle information file specifying a battery cycle count value and a battery stats log file including both historical battery charge data and historical battery drain data as described with reference to FIGS. 1-3. Step 58 then results in the processing resource 24*a* of the battery profiler server 24 identifying three candidate methods from the plurality of methods stored in the battery profiler database 26, each candidate method being capable of determining a corresponding battery condition value for the battery 4 of the mobile electronic device 2, namely a battery cycle method for determining a battery cycle count as the corresponding battery condition value, a battery charge method for determining a corresponding battery condition value based on a present or actual charge capacity of the battery derived from the historical battery charge data, and a battery drain method for determining a corresponding battery condition value based on a present or actual charge capacity of the battery derived from the historical battery drain data. Each of these three capable methods will be described in detail below.

In response to the processing resource 24*a* of the battery profiler server 24 determining that one or more of the candidate methods are capable of determining a corresponding battery condition value, the method continues at step 60 with the processing resource 24*a* of the battery profiler server 24 transmitting instructions for performing one or more of the capable methods to the mobile electronic device 2. The app 16 then causes the processing resource 8 to perform one or more of the capable methods to thereby determine one or more corresponding battery condition values at step 62.

For example, where the processing resource 8 performs the battery cycle method, the processing resource 8 simply looks up the battery cycle count value stored in the battery cycle information file in the memory 6 of the mobile electronic device 2 and returns the battery cycle count value as at least one of the determined battery condition values.

Where the processing resource 8 performs the battery charge method, the processing resource 8 performs the method 200 described with reference to FIGS. 5-7. The method 200 begins at step 202 with the processing resource 8 accessing the design capacity $Q_{des}$ of the battery 4 from the battery stats log file stored in the memory 6 of the mobile electronic device 2.

The method continues at step 206 with the processing resource 8 using the battery charging status flags 110, 112, 120, 122 to identify one or more battery charge intervals during which the battery 4 was charged.

As will be described in more detail below, the method continues at step 208 with the processing resource 8 identifying one or more battery charge ranges within each of the one or more battery charge intervals and determining, for each battery charge range, an estimate $Q_{act}(k)$ of the actual charge capacity $Q_{act}$ of the battery, where k is an index assigned to each battery charge range according to the numerical order in which the fractional values of the actual capacity $Q_{act}$ of the battery in the battery charge ranges occur.

At step 210, the processing resource 8 estimates the actual capacity $Q_{act}$ of the battery 4 by averaging the estimates $Q_{act}(k)$ of the actual capacity of the battery 4 for all of the battery charge ranges according to the formula:

$$Q_{act} = \frac{1}{N_k} \sum_{\forall k} Q_{act}(k)$$

where $N_k$ is the total number of battery charge ranges. It is known that the charge behaviour of a battery of a mobile electronic device is generally non-linear such that the accuracy of the measurement of the battery charge information may vary across the full range of fractional values of the actual capacity $Q_{act}$ of the battery 4. Consequently, averaging the estimates $Q_{act}(k)$ of the actual capacity of the battery 4 for all of the battery charge ranges in this way may improve the accuracy of the estimate of the actual capacity $Q_{act}$ of the battery 4 because it may average out or reduce any variations in the accuracy of the battery charge information across the full range of fractional values of the actual capacity $Q_{act}$ of the battery 4. It is also thought that the accuracy of the measurement of the battery charge information may vary with usage of the mobile electronic device 2 during charging. Averaging the estimates $Q_{act}(k)$ of the actual capacity of the battery 4 for all of the battery charge ranges in this way, may also help to account for any variation in the accuracy of the measurement of the battery charge information with usage of the mobile electronic device 2 during charging, thereby helping to improve the accuracy of the estimate of the actual capacity $Q_{act}$ of the battery 4.

At step 212, the processing resource 8 returns one or more of the following quantities as one or more of the battery condition values:

the ratio $Q_{act}/Q_{des}$;

the percentage $100 \times Q_{act}/Q_{des}$;

a percentage wear value $W_p$ determined according to:

$$W_p = 100 \times \left(1 - \frac{Q_{act}}{Q_{des}}\right);$$

and
a fractional wear value $W_f$ determined according to:

$$W_f = 1 - \frac{Q_{act}}{Q_{des}}.$$

Step 208 of the method of FIG. 5 will now be described with reference to FIGS. 6 and 7. At step 220, the processing resource 8 identifies any common and any unique battery charge ranges. Specifically, the processing resource 8:

identifies any common battery charge ranges in which the fractional values of the actual capacity $Q_{act}$ of the battery 4 of one battery charge interval overlap with the fractional values of the actual capacity $Q_{act}$ of the battery 4 of any one or more other battery charge intervals; and identifies any unique battery charge ranges in which none of the fractional values of the actual capacity $Q_{act}$ of the battery 4 of one battery charge interval overlap with the fractional values of the actual capacity $Q_{act}$ of the battery 4 of any one or more other battery charge intervals.

Figure 7:
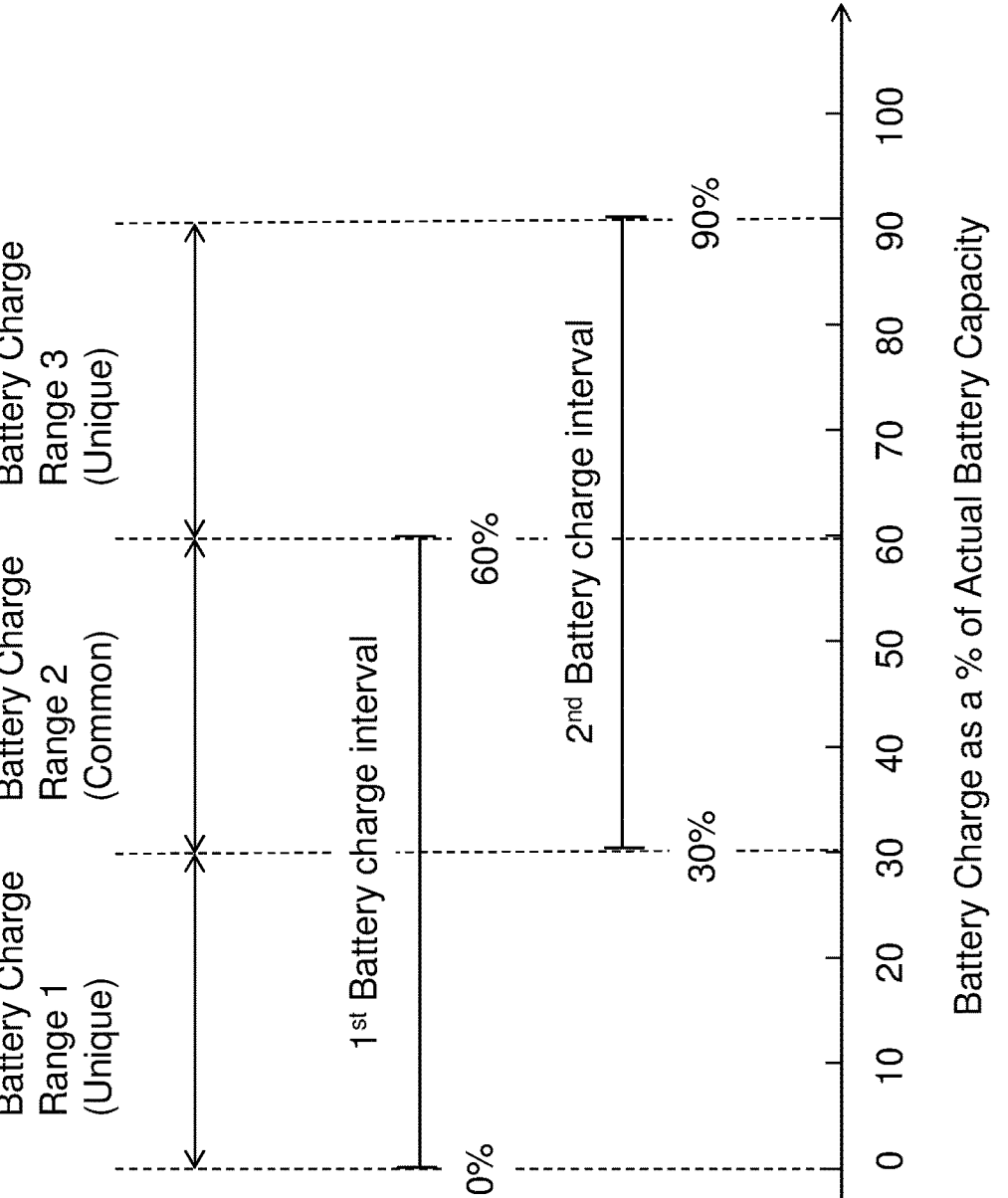
FIG. 7 shows an example of two overlapping battery charge intervals in a battery stats log file.

For example, referring to FIG. 7 there are shown two overlapping battery charge intervals: a first battery charge interval for which the fractional values of the actual capacity $Q_{act}$ of the battery range from 0% to 60% and a second battery charge interval for which the fractional values of the actual capacity $Q_{act}$ of the battery range from 30% to 90%. Accordingly, the processing resource 8 identifies three battery charge ranges:

i. a first battery charge range, battery charge range 1, which has fractional values of the actual capacity $Q_{act}$ of the battery ranging from 0% to 30% and which is unique to the first battery charge interval;

ii. a second battery charge range, battery charge range 2, which has fractional values of the actual capacity $Q_{act}$ of the battery ranging from 30% to 60% and which is common to the first and second battery charge intervals; and iii. a third battery charge range, battery charge range 3, which has fractional values of the actual capacity $Q_{act}$ of the battery ranging from 60% to 90% and which is unique to the second battery charge interval.

Referring back to FIG. 6, the method continues at step 222 with the processing resource 8 determining, for each common battery charge range (e.g. battery charge range 2 of FIG. 5) and for each battery charge interval to which the common battery charge range is common (e.g. the first and second battery charge intervals of FIG. 7), an estimate $Q_{act}(i, k)$ of the actual capacity of the battery according to the formula:

$$Q_{act}(i, k) = \Delta Q(i, k) \times 100 / [p_{final}(i, k) - p_{initial}(i, k)]$$

where $p_{initial}(i, k)$ is the initial fractional value of the actual capacity of the battery expressed as a percentage at the beginning of the $k^{th}$ battery charge range in the $i^{th}$ battery charge interval;

where $p_{final}(i, k)$ is the final fractional value of the actual capacity of the battery expressed as a percentage at the end of the $k^{th}$ battery charge range in the $i^{th}$ battery charge interval; and where $\Delta Q(i, k)$ is the total charge supplied to the battery over the $k^{th}$ battery charge range in the $i^{th}$ battery charge interval.

For the example shown in FIG. 7, there is only one common battery charge range, namely battery charge range 2, and two battery charge intervals, namely the first and second battery charge intervals. Accordingly, step 222 results in the processing resource 8 determining:

$$p_{initial}(1, 2) = 30 \text{ and } p_{final}(1, 2) = 60; \text{ and}$$

$$p_{initial}(2, 2) = 30 \text{ and } p_{final}(2, 2) = 60.$$

The processing resource 8 also determines, for each common battery charge range (e.g. battery charge range 2 of FIG. 7) and for each battery charge interval to which the common battery charge range is common (e.g. the first and second battery charge intervals of FIG. 7), the total charge $\Delta Q (i, k)$ supplied to the battery 4 over the $k^{th}$ battery charge range in the $i^{th}$ battery charge interval according to:

$$\Delta Q(i, k) = I_{avg}(i, k) \times T(i, k)$$

where $t_{initial}(i, k)$ is the average battery charging current supplied to the battery 4 over the $k^{th}$ battery charge range in the $i^{th}$ battery charge interval, and $T(i, k)$ is the duration of the $k^{th}$ battery charge range in the $i^{th}$ battery charge interval determined according to the formula:

$$T(i, k) = t_{final}(i, k) - t_{initial}(i, k)$$

where $t_{initial}(i, k)$ is the relative time value or time stamp corresponding to the first battery charge data point of the $k^{th}$ battery charge range in the $i^{th}$ battery charge interval, and $t_{final}(i, k)$ is the relative time value or time stamp corresponding to the last battery charge data point of the $k^{th}$ battery charge range in the $i^{th}$ battery charge interval.

For the example shown in FIG. 7, there is only one common battery charge range, namely battery charge range 2. Accordingly, for the example shown in FIG. 7, the processing resource 8 determines:

$$\Delta Q(1, 2) = I_{avg}(1, 2) \times T(1, 2)$$

$$\Delta Q(2, 2) = I_{avg}(2, 2) \times T(2, 2)$$

where:

$I_{avg}(1,2)$ is the average current determined for battery charge range 2 from the battery charging data in the first battery charge interval;

$T(1,2)$ is the duration associated with battery charge range 2 from the time data in the first battery charge interval;

$I_{avg}(2,2)$ is the average current determined for battery charge range 2 from the battery charging data in the second battery charge interval; and $T(2,2)$ is the duration associated with battery charge range 2 from the time data in the second battery charge interval.

The processing resource 8 determines, for each common battery charge range and for each battery charge interval to which the common battery charge range is common, the average battery charging current $I_{avg}(i, k)$ supplied to the battery 4 over the $k^{th}$ battery charge range in the $i^{th}$ battery charge interval according to the formula:

$$I_{avg}(i, k) = \frac{1}{N_j(i, k)} \sum_{\forall j \in i, k} I_j$$

where $I_j$ is the battery charging current supplied to the battery corresponding to the $j^{th}$ historical battery charge data point, $\forall j \in i$, k indicates that the summation should be performed over all of the historical battery charge data points in the $k^{th}$ battery charge range in the $i^{th}$ battery charge interval, and $N_j(i, k)$ is the total number of historical battery charge data points in the $k^{th}$ battery charge range in the $i^{th}$ battery charge interval.

For the example shown in FIG. 7, there is only one common battery charge range, namely battery charge range 2, and two battery charge intervals, namely the first and second battery charge intervals. The processing resource 8 determines the average battery charging current $I_{avg}(1,2)$ supplied to the battery 4 over battery charge range 2 in the first battery charge interval according to the formula:

$$I_{avg}(1, 2) = \frac{1}{N_j(1, 2)} \sum_{\forall j \in i=1, k=2} I_j$$

where $I_j$ is the battery charging current supplied to the battery corresponding to the $i^{th}$ historical battery charge data point, $\forall j \in i=1$, k=2 indicates that the summation should be performed over all of the historical battery charge data points in battery charge range 2 in the $1^{st}$ battery charge interval, and $N_j(1,2)$ is the total number of historical battery charge data points in battery charge range 2 in the $1^{st}$ battery charge interval.

Similarly, the processing resource 8 determines the average battery charging current $I_{avg}(1,2)$ supplied to the battery over battery charge range 2 in the second battery charge interval according to the formula:

$$I_{avg}(2, 2) = \frac{1}{N_j(2, 2)} \sum_{\forall j \in i=2, k=2} I_j$$

where $I_j$ is the battery charging current supplied to the battery corresponding to the $j^{th}$ historical battery charge data point, $\forall j \in i=2$, k=2 indicates that the summation should be performed over all of the historical battery charge data points in battery charge range 2 in the $2^{nd}$ battery charge interval, and $N_j(2,2)$ is the total number of historical battery charge data points in battery charge range 2 in the $2^{nd}$ battery charge interval.

Figure 6:
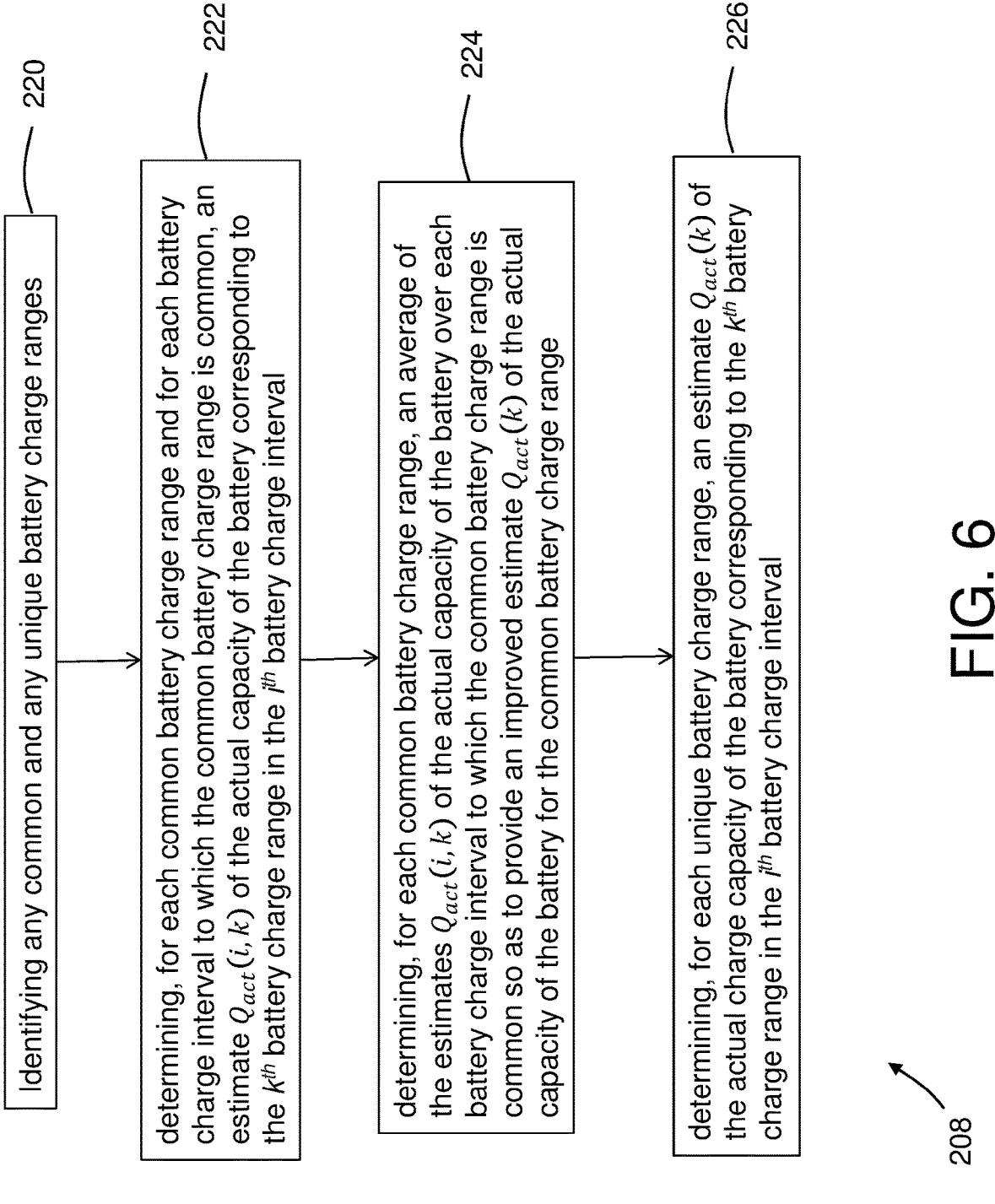
FIG. 6 shows step 208 of the method of FIG. 5 in more detail.

As shown in FIG. 6, the method continues at step 224 with the processing resource 8 determining, for each common battery charge range, an average of the estimates $Q_{act}(i, k)$ of the actual capacity of the battery 4 over each battery charge interval to which the common battery charge range is common so as to provide an improved estimate $Q_{act}(k)$ of the actual capacity $Q_{act}$ of the battery for the $k^{th}$ battery charge range according to the formula:

$$Q_{act}(k) = \frac{1}{N_{icom}(k)} \sum_{\forall i \in i_{com}} Q_{act}(i, k)$$

where $\forall i \in i_{com}$ indicates that the summation should be performed over all of the battery charge intervals to which the $k^{th}$ battery charge range is common and $N_{icom}(k)$ is the number of battery charge intervals to which the $k^{th}$ battery charge range is common. Averaging the estimates of the actual capacity of the battery 4 in this way across each battery charge interval to which each common battery charge range is common, may help to account for any variation in the usage of the mobile electronic device during charging in the common battery charge range in different battery charge intervals, thereby helping to improve the accuracy of the estimate of the actual capacity of the battery 4.

For the example shown in FIG. 7, there is only one common battery charge range, namely battery charge range 2, and two battery charge intervals. Accordingly, for the example shown in FIG. 7 at step 224, the processing resource 8 simply averages the estimates $Q_{act}(1,2)$ and $Q_{act}(2,2)$ to determine an estimate of the actual capacity of the battery for battery charge range 2 according to the formula:

$$Q_{act}(2) = \frac{1}{2} \sum_{i=1,2} Q_{act}(i, 2)$$

Averaging the estimates of the actual capacity of the battery 4 in this way over a battery charge range for different battery charge intervals, helps to account for any variation in the usage of the mobile electronic device 2 during charging, thereby helping to improve the accuracy of the estimate of the actual capacity of the battery 4.

At step 226 of FIG. 6, the processing resource 8 determines, for each unique battery charge range, an estimate $Q_{act}(k)$ of the actual capacity of the battery according to the formula:

$$Q_{act}(k) = \Delta Q(i, k) \times / [p_{final}(i, k) - p_{initial}(i, k)]$$

where $p_{initial}(i, k)$ is the initial fractional value of the actual capacity of the battery 4 expressed as a percentage at the beginning of the $k^{th}$ battery charge range in the $i^{th}$ battery charge interval;

where $p_{final}(i, k)$ is the final fractional value of the actual capacity of the battery 4 expressed as a percentage at the end of the $k^{th}$ battery charge range in the $i^{th}$ battery charge interval; and where $\Delta Q(i, k)$ is the total charge supplied to the battery over the $k^{th}$ battery charge range in the $i^{th}$ battery charge interval.

For the example of FIG. 7 there are two unique battery charge ranges, namely battery charge ranges 1 and 3. Accordingly step 226 results in the processing resource 8 determining:

$$p_{initial}(1, 2) = 0 \text{ and } p_{final}(1, 1) = 30; \text{ and}$$

-continued $$p_{initial}(2, 3) = 60 \text{ and } p_{final}(2, 3) = 90.$$

The processing resource 8 also determines, for each unique battery charge range, the total charge $\Delta Q(k)$ supplied to the battery over the $k^{th}$ battery charge range in the $i^{th}$ battery charge interval according to:

$$\Delta Q(k) = I_{avg}(i, k) \times T(i, k)$$

where $I_{avg}(i, k)$ is the average battery charging current supplied to the battery over the $k^{th}$ battery charge range in the $i^{th}$ battery charge interval, and $T(i, k)$ is the duration of the $k^{th}$ battery charge range in the $i^{th}$ battery charge interval determined according to the formula:

$$T(i, k) = t_{final}(i, k) - t_{initial}(i, k)$$

where $t_{initial}(i, k)$ is the relative time value or time stamp corresponding to the first battery charge data point of the $k^{th}$ battery charge range in the $i^{th}$ battery charge interval, and $t_{final}(i, k)$ is the relative time value or time stamp corresponding to the last battery charge data point of the $k^{th}$ battery charge range in the $i^{th}$ battery charge interval.

For the example shown in FIG. 7, there are two unique battery charge ranges, namely battery charge ranges 1 and 3. Accordingly, for the example shown in FIG. 7, the processing resource 8 determines the total charge $\Delta Q(1)$ supplied to the battery over battery charge range 1 in the $1^{st}$ battery charge interval according to:

$$\Delta Q(1) = I_{avg}(1, 1) \times T(1, 1)$$

and the total charge $\Delta Q(3)$ supplied to the battery over battery charge range 3 in the $2^{nd}$ battery charge interval according to:

$$\Delta Q(3) = I_{avg}(2, 3) \times T(2, 3)$$

The processing resource 8 determines, for each unique battery charge range, the average battery charging current $I_{avg}(i, k)$ supplied to the battery over the $k^{th}$ battery charge range in the $i^{th}$ battery charge interval according to the formula:

$$I_{avg}(i, k) = \frac{1}{N_j(i, k)} \sum_{\forall j \in i, k} I_j$$

where $I_j$ is the battery charging current supplied to the battery corresponding to the $j^{th}$ historical battery charge data point, $\forall j \in i, k$ indicates that the summation should be performed over all of the historical battery charge data points in the $k^{th}$ battery charge range in the $i^{th}$ battery charge interval, and $N_j(i, k)$ is the total number of historical battery charge data points in the $k^{th}$ battery charge range in the $i^{th}$ battery charge interval.

For the example shown in FIG. 7, there are two unique battery charge ranges, namely battery charge ranges 1 and 3, wherein battery charge range 1 is unique to the first battery charge interval and battery charge range 3 is unique to the second battery charge interval. The processing resource 8 determines, for unique battery charge range 1, the average battery charging current $I_{avg}(1,1)$ supplied to the battery over battery charge range 1 in the first battery charge interval according to the formula:

$$I_{avg}(1, 1) = \frac{1}{N_j(1, 1)} \sum_{\forall j \in i=1, k=1} I_j$$

where $I_j$ is the battery charging current supplied to the battery corresponding to the $j^{th}$ historical battery charge data point, $\forall j \in i=1$, $k=1$ indicates that the summation should be performed over all of the historical battery charge data points in battery charge range 1 in the $1^{st}$ battery charge interval, and $N_j (1,1)$ is the total number of historical battery charge data points in battery charge range 1 in the $1^{st}$ battery charge interval.

Similarly, the processing resource 8 determines, for unique battery charge range 3, the average battery charging current $I_{avg}(2,3)$ supplied to the battery over battery charge range 3 in the second battery charge interval according to the formula:

$$I_{avg}(2, 3) = \frac{1}{N_j(2, 3)} \sum_{\forall i=2, k=3} I_j$$

where $I_j$ is the battery charging current supplied to the battery corresponding to the $j^{th}$ historical battery charge data point, $\forall j \in i=2$, $k=3$ indicates that the summation should be performed over all of the historical battery charge data points in battery charge range 3 in the $2^{nd}$ battery charge interval, and $N_j(2,3)$ is the total number of historical battery charge data points in battery charge range 3 in the $2^{nd}$ battery charge interval.

Returning to step 210 shown in FIG. 5, for the example of FIG. 7, the processor 6 estimates the actual capacity $Q_{act}$ of the battery by averaging the estimates $Q_{act}(k)$ of the actual capacity of the battery 4 for all of the battery charge ranges $k=1$, 2 and 3 according to the formula:

$$Q_{act} = \frac{1}{3} \sum_{k=1,2,3} Q_{act}(k)$$

It is known that the charge behaviour of the battery 4 of the mobile electronic device 2 is generally non-linear and it is thought that the accuracy of the measurement of the battery charge information may vary across the full range of fractional values of the actual capacity $Q_{act}$ of the battery 4. Consequently, averaging the estimates $Q_{act}(k)$ of the actual capacity of the battery 4 for all of the battery charge ranges in this way may improve the accuracy of the estimate of the actual capacity $Q_{act}$ of the battery 4 because it may average out or reduce any variations in the accuracy of the battery charge information across the full range of fractional values of the actual capacity $Q_{act}$ of the battery 4. It is also thought that the accuracy of the measurement of the battery charge information may vary with usage of the mobile electronic device 2 during charging. Averaging the estimates $Q_{act}(k)$ of the actual capacity of the battery 4 for all of the battery charge ranges in this way, may also help to account for any variation in the accuracy of the measurement of the battery charge information with usage of the mobile electronic device 2 during charging, thereby helping to improve the accuracy of the estimate of the actual capacity $Q_{act}$ of the battery 4.

Where the processing resource 8 performs the battery drain method, the processing resource 8 determines one or more of the battery condition values based at least in part on the historical battery drain data. Specifically, with reference to the description of the historical battery drain data of FIG. 3 above, the processing resource 8 accesses the design capacity $Q_{des}$ of the battery 4, the lower limit min($\Sigma$Q) for the cumulative charge consumed over the drain period, the upper limit max($\Sigma$Q) for the cumulative charge consumed over the drain period, from the battery stats log file stored in the memory 6 of the mobile electronic device 2. The processing resource 8 then determines an average value avg($\Sigma$Q) for the cumulative charge consumed over the drain period according to $$avg\left(\sum Q\right) = \frac{1}{2}\left[\min\left(\sum Q\right) + \max\left(\sum Q\right)\right].$$

For the specific battery drain data shown in FIG. 3, this results in an average value avg($\Sigma$Q) for the cumulative charge consumed over the drain period of $$\frac{1}{2}[4887 + 5427] = 5157 \text{ mAh}.$$

Where the historical battery drain data includes a cumulative percentage drop in charge $\Sigma$p over the drain period, the processing resource 8 determines an actual capacity $Q_{act}$ of the battery 4 according to $Q_{act}$=avg($\Sigma$Q)$\times$100/$\Sigma$p. For the specific battery drain data shown in FIG. 3, this results in $Q_{act}$=5157$\times$100/201=2566 mAh.

The processing resource 8 then returns one or more of the following quantities as one or more of the battery condition values: the ratio $Q_{act}/Q_{des}$; the percentage 100$\times$$Q_{act}/Q_{des}$; a percentage wear value $W_p$ determined according to $W_p$=100$\times$(1$-$$Q_{act}/Q_{des}$); and a fractional wear value $W_f$ determined according to $W_f$=1$-$$Q_{act}/Q_{des}$. For the specific battery drain data shown in FIG. 3, this results in the processing resource 8 returning one or more of the following: a ratio $Q_{act}/Q_{des}$=2566/2700=0.95; a percentage 100$\times$$Q_{act}/Q_{des}$=95%; a percentage wear value $W_p$=5%; or a fractional wear value $W_f$ of 0.05.

Referring back to FIG. 4, following step 62, the app 16 causes the user interface 10 to display each determined battery condition value and/or causes the mobile electronic device 2 to transmit each determined battery condition value to the battery profiler server 24 or a further server such as a report server (not shown in FIG. 1) at step 64.

It will be appreciated by one of ordinary skill in the art that various modifications may be made to the foregoing system and method without departing from the scope of the present invention as defined by the claims. For example, a first alternative method may include an additional step performed between steps 58 and 60 of FIG. 4, which additional step includes the processing resource 24a of the battery profiler server 24 selecting an optimum one of the one or more capable methods based at least in part on the mobile electronic device data 14 and the information relating to each candidate method, wherein the battery condition value determined using the optimum one of the one or more capable methods is known to provide a more accurate representation of the condition of the battery of the mobile electronic device than the battery condition value determined using any other one of the capable methods. In this regard, the processing resource 24a of battery profiler server 24 may select the optimum method from the one or more capable methods according to a priori knowledge of an accuracy of each capable method. For example, it is known that a battery condition value determined using the battery cycle method is more accurate than a battery condition value determined using the battery charge method which is, in turn, more accurate than a battery condition value determined using the battery drain method. Accordingly, if the processing resource 24a of the battery profiler server 24 fetches the battery cycle method, the battery charge method, and the battery drain method from the battery profiler database 26 and determines that the battery cycle method, the battery charge method and the battery drain method are each capable of determining a corresponding battery condition value based on the mobile electronic device data 14, the processing resource 24a of battery profiler server 24 may select the battery cycle method as the optimum method in preference to either the battery charge method or the battery drain method. Similarly, when the processing resource 24a of the battery profiler server 24 fetches the battery cycle method, the battery charge method and the battery drain method from the battery profiler database 26, but determines that the battery cycle method is not capable of determining a corresponding battery condition value based on the mobile electronic device data 14, the processing resource 24a of the battery profiler server 24 may select the battery charge method as the optimum method in preference to the battery drain method. Moreover, when the processing resource 24a of the battery profiler server 24 fetches the battery cycle method, the battery charge method and the battery drain method from the battery profiler database 26, but determines that neither the battery cycle method nor the battery charge method are capable of determining a corresponding battery condition value based on the mobile electronic device data 14, the processing resource 24a of the battery profiler server 24 may select the battery drain method as the optimum method. In addition, when the processing resource 24a of the battery profiler server 24 fetches the battery cycle method, the battery charge method and the battery drain method from the battery profiler database 26, but determines that none of the battery cycle method, the battery charge method and the battery drain method are capable of determining a corresponding battery condition value based on the mobile electronic device data 14, the processing resource 24a of the battery profiler server 24 is not able to select an optimum method or to determine a battery condition value.

Rather than transmitting instructions for performing each of the one or more of the capable methods to the mobile electronic device 2 as described with reference to step 60 of FIG. 4 above, the first alternative method further includes the processing resource 24a of the battery profiler server 24 transmitting instructions for performing only the optimum one of the capable methods to the mobile electronic device 2, and performing the optimum one of the capable methods to thereby determine the corresponding battery condition value.

In a variant of the first alternative method described above, rather than the processing resource 24a of the battery profiler server 24 performing the additional step of selecting the optimum one of the one or more capable methods based at least in part on the mobile electronic device data 14 and the information relating to each candidate method between steps 58 and 60 of FIG. 4, the app 16 may perform the additional step of selecting the optimum one of the one or more capable methods based at least in part on the mobile electronic device data 14 and the information relating to each candidate method at step 62 of FIG. 4.

In a second alternative method, the information relating to each candidate method which the processing resource 24*a* of the battery profiler server 24 fetches from the battery profiler database 26 at step 56 of FIG. 4 includes a corresponding battery condition threshold value and an additional step is performed which includes comparing each determined battery condition value with the corresponding battery condition threshold value and determining whether the battery condition is compliant or non-compliant with a predetermined battery condition test according to the result of the comparison. The additional step may, for example be performed by the processing resource 24*a* of the battery profiler server 24 between steps 58 and 60 of FIG. 4 or the additional step may be performed by the app 16 at step 62 of FIG. 4.

FIGS. 8A and 8B together illustrate a combination of the first and second alternative methods described above. Specifically, FIG. 8A shows pseudo code instructions for execution by the processing resource 24*a* of the battery profiler server 24 for performing an additional step between steps 58 and 60 of FIG. 4 of selecting an optimum one of the one or more capable methods based at least in part on the mobile electronic device data 14 and the information relating to each candidate method. FIG. 8B shows pseudo code instructions for execution by the processing resource 24*a* of the battery profiler server 24 for performing an additional step between steps 58 and 60 of FIG. 4 of comparing one of the determined battery condition values with the corresponding battery condition threshold value and determining whether the battery condition is compliant or non-compliant with a predetermined battery condition test according to the result of the comparison at step 62 of FIG. 4. Specifically, FIG. 8B shows pseudo code instructions for execution by the battery profiler server 24 for comparing a determined battery cycle count value "Battery_Cycle" with a corresponding battery condition threshold value "cycle_threshold" and determining whether the battery condition is "Good" or "Bad" according to the result of the comparison.

In a third alternative method, the app 16 extracts historical battery performance data from the memory 6 of the mobile electronic device 2 and transmits the historical battery performance data to the battery profiler server 24 at step 54 of FIG. 4. Specifically, the app 16 extracts the battery cycle information file stored in the memory 6 of the mobile electronic device 2 and the battery stats log file stored in the memory 6 of the mobile electronic device 2 and transmits the battery cycle information file and the battery stats log file to the battery profiler server 24 at step 54.

In a fourth alternative method, rather than the processing resource 24*a* of the battery profiler server 24 transmitting instructions for performing one or more of the capable methods to the mobile electronic device 2 and the app 16 performing the one or more of the capable methods to thereby determine one or more corresponding battery condition values, the processing resource 24*a* of the battery profiler server 24 may perform one or more of the capable methods to thereby determine one or more corresponding battery condition values and the processing resource 24*a* of the battery profiler server 24 may transmit the one or more corresponding battery condition values to the mobile electronic device 2. Such a method may avoid any requirement for the processing resource 24*a* of the battery profiler server 24 to transmit any instructions for performing one or more of the capable methods to the mobile electronic device 2. In a variant of the fourth alternative method, the processing resource 24*a* of the battery profiler server 24 may execute some of the instructions for performing each one or more of the capable methods at the battery profiler server 24 and the app 16 may execute some of the instructions for performing each one or more of the capable methods at the mobile electronic device 2.

A fifth alternative method may comprise the following steps:

i. a user installs an application onto the mobile electronic device;

ii. the application accesses via APIs available mobile electronic device data stored on the mobile electronic device and available battery data stored on the mobile electronic device;

iii. the application sends the available mobile electronic device data and the available battery data to a cloud server;

iv. the cloud server compares the received mobile electronic device data and the received battery data to information maintained on a database and identifies the best (e.g. most accurate) battery condition estimation method based on the make, model and version of the Android OS of the mobile electronic device and the battery data; and v. instructions for executing the identified battery condition estimation method are downloaded from the cloud server to the mobile electronic device and the instructions are executed to estimate the battery condition.

A sixth alternative method may comprise the following steps:

i. a user installs an app onto an Android device;

ii. the app is launched;

iii. the app fetches the manufacturer, model and OS version of the Android device and a design capacity of the battery from Android APIs;

iv. the app fetches battery cycle information from a battery cycle information file stored on the Android device, and battery drain log and battery current information from a battery stats log file stored on the Android device;

v. the app uploads the battery cycle, battery drain log and battery current information to a battery profile cloud;

vi. the battery profile cloud includes a list of methods that calculate battery life based on device information received from the app;

vii. the battery profile cloud determines or selects the method to be used for calculating a battery life;

viii. the battery profile cloud sends the selected battery life calculation method as well as any required threshold values to the Android device;

ix. the app uses the selected battery life calculation method as well as any required threshold values to calculate a battery life and/or to determine a battery grade or condition parameter;

x. the app displays the calculated battery life and/or to battery grade or condition parameter on a user interface of the Android device; and xi. the app uploads the calculated battery life and/or to battery grade or condition parameter to a report cloud along with the manufacturer, model and OS of the Android device.

The invention claimed is:

1. A method for use in determining a condition of a battery of a mobile electronic device, the method comprising:

receiving, at a server, mobile electronic device data from a mobile electronic device;

receiving, at the server, information relating to each candidate method of a plurality of candidate methods, each candidate method being configured for determining a value of a corresponding battery condition, wherein the battery condition value corresponding to each candidate method is representative of the condition of the battery of the mobile electronic device;

determining whether any of the candidate methods are capable of determining a corresponding battery condition value based at least in part on the mobile electronic device data and the information relating to each candidate method;

in response to determining that one or more of the candidate methods is capable of determining one or more corresponding battery condition values, performing the one or more of the capable methods to thereby determine the one or more corresponding battery condition values; and wherein:

the mobile electronic device data comprises historical battery performance data that comprises historical battery charge data, the historical battery charge data including at least time information and battery charging status information;

the method further comprises using the time information and the battery charging status information to identify one or more battery charge intervals during which the battery was charged;

the historical battery charge data comprises a plurality of historical battery charge data points for each battery charge interval, wherein each historical battery charge data point comprises time information, battery charging current information, and battery charge information;

the time information comprises a relative time value or time stamp;

the battery charging current information comprises a value of charging current supplied to the battery;

the battery charge information comprises a fractional value of the present or actual capacity $Q_{act}$ of the battery, expressed as a fraction or as a percentage of the present or actual capacity $Q_{act}$ of the battery; and wherein the method further comprises:

identifying one or more battery charge ranges within each of the one or more battery charge intervals;

determining, for each battery charge range, an estimate $Q_{act}(k)$ of the present or actual charge capacity $Q_{act}$ of the battery, where k is an index assigned to each battery charge range according to the numerical order in which the fractional values of the present or actual capacity $Q_{act}$ of the battery in the battery charge ranges occur;

estimating the present or actual capacity $Q_{act}$ of the battery by averaging the estimates $Q_{act}(k)$ of the present or actual capacity of the battery for all of the battery charge ranges according to the formula:

$$Q_{act} = \frac{1}{N_k} \sum_{\forall k} Q_{act}(k)$$

24 where $N_k$ is the total number of battery charge ranges; and determining one or more of the battery condition values based at least in part on the present or actual capacity $Q_{act}$ of the battery.

2. The method of claim 1, wherein the mobile electronic device data comprises at least one of a make, a model, an operating system, and a version number of the operating system of the mobile electronic device and at least one of:

data relating to the battery of the mobile electronic device;

a design capacity $Q_{des}$ of the battery; and a make and/or a model of the battery of the mobile electronic device.

3. The method of claim 1, further comprising extracting the historical battery performance data from the mobile electronic device data from one of a battery cycle information file stored on the mobile electronic device or from a battery stats log file stored on the mobile electronic device.

4. The method of claim 1, comprising transmitting the mobile electronic device data from the mobile electronic device data to the server.

5. The method of claim 1, comprising running an app on the mobile electronic device to extract the mobile electronic device data from data stored on the mobile electronic device and to transmit the mobile electronic device data from the mobile electronic device data to the server.

6. The method of claim 1, wherein the information relating to each candidate method comprises instructions for performing each candidate method.

7. The method of claim 1, comprising:

transmitting, from the server to the mobile electronic device, instructions for performing each one or more of the capable methods; and executing, at the mobile electronic device, the instructions for performing each one or more of the capable methods.

8. The method of claim 1, comprising selecting one of the one or more capable methods based at least in part on the mobile electronic device data and the information relating to each candidate method and performing the selected one of the one or more capable methods to thereby determine a corresponding battery condition value, wherein the battery condition value determined using the selected one of the one or more capable methods is known to provide a more accurate representation of the condition of the battery of the mobile electronic device than the battery condition value determined using any other one of the capable methods.

9. The method of claim 8, comprising:

transmitting, from the server to the mobile electronic device, instructions for performing the selected one of the one or more capable methods; and executing, at the mobile electronic device, the instructions for performing the optimum one of the one or more capable methods.

10. The method of claim 1, wherein the information relating to each candidate method comprises a corresponding battery condition threshold value and the method comprises comparing each determined battery condition value with the corresponding battery condition threshold value and determining whether the battery condition is compliant or non-compliant with a predetermined battery condition test according to the result of the comparison.

11. The method of claim 1, wherein receiving the information relating to each candidate method of a plurality of candidate methods comprises fetching the information relating to each candidate method from a database to the server.

12. The method of claim 11, comprising:

updating or modifying the information in the database relating to one or more of the candidate methods; or storing, in the database, information relating to one or more additional candidate methods, each additional candidate method being configured for determining a corresponding battery condition value, wherein the battery condition value corresponding to each candidate method is representative of the condition of the battery of the mobile electronic device.

13. The method of claim 1, comprising making each determined battery condition value available at the mobile electronic device by displaying each determined battery condition value at the mobile electronic device, and/or transmitting, from the mobile electronic device to the server and/or to a further server, each determined battery condition value.

14. The method of claim 1, wherein the historical battery performance data comprises a battery cycle count value representing the number of full discharge/charge cycles associated with the battery of the mobile electronic device and the method comprises returning the battery cycle count value as at least one of the determined battery condition values.

15. The method of claim 1, wherein the historical battery performance data comprises historical battery drain data and the method comprises determining one or more of the battery condition values based at least in part on the historical battery drain data.

16. The method of claim 15, wherein the historical battery drain data comprises a lower limit $\min(\Sigma\Delta Q)$ for a cumulative charge consumed over a drain period, and an upper limit $\max(\Sigma\Delta Q)$ for the cumulative charge consumed over the drain period, wherein the drain period is defined as a time period elapsed since the last full charge of the battery of the mobile electronic device, and wherein the method comprises determining an average value $\mathrm{avg}(\Sigma\Delta Q)$ for the cumulative charge consumed over the drain period according to $$\mathrm{avg}\left(\sum\Delta Q\right) = \frac{1}{2}\left[\min\left(\sum\Delta Q\right) + \max\left(\sum Q\Delta\right)\right].$$

17. The method of claim 16, wherein the historical battery drain data comprises a cumulative percentage drop in charge $\Sigma\Delta p$ over the drain period and the method comprises:

determining an actual capacity $Q_{act}$ of the battery according to $Q_{act}=\mathrm{avg}(\Sigma\Delta Q)\times 100/\Sigma\Delta p$; and determining one or more of the battery condition values based at least in part on the present or actual capacity $Q_{act}$ of the battery; or wherein the historical battery drain data comprises a cumulative fractional drop in charge $\Sigma\Delta\Delta f$ over the drain period and the method comprises:

determining an actual capacity $Q_{act}$ of the battery according to $Q_{act}=\mathrm{avg}(\Sigma\Delta Q)/\Sigma\Delta f$; and determining one or more of the battery condition values based at least in part on the present or actual capacity $Q_{act}$ of the battery.

18. The method of claim 1, comprising returning one or more of the following quantities as one or more of the battery condition values:

the ratio $Q_{act}/Q_{des}$;

the percentage $100\times Q_{act}/Q_{des}$;

a percentage wear value $W_p$ determined according to $W_p=100\times(1-Q_{act}/Q_{des})$; and a fractional wear value $W_f$ determined according to $W_f=1-Q_{act}/Q_{des}$.

19. The method of claim 1, wherein the mobile electronic device comprises or runs an Android operating system.

20. An app which, when executed on a mobile electronic device, causes a method to be performed as claimed in claim 1.

21. Instructions for a server for use in determining a condition of a battery of a mobile electronic device, which instructions, when executed by a processing resource of the server, cause the server to perform the method of claim 1.

22. A server for use in determining a condition of a battery of a mobile electronic device, the server comprising a processing resource and a non-transitory memory containing instructions which, when executed by the processing resource, cause the processing resource to:

receive mobile electronic device data from the mobile electronic device;

receive information relating to each candidate method of a plurality of candidate methods, each candidate method being configured for determining a value of a corresponding battery condition, wherein the battery condition value corresponding to each candidate method is representative of the condition of the battery of the mobile electronic device;

determine whether any of the candidate methods are capable of determining a corresponding battery condition value based at least in part on the mobile electronic device data and the information relating to each candidate method; and in response to determining that one or more of the candidate methods is capable of determining one or more corresponding battery condition values, cause the one or more of the capable methods to be performed to thereby determine the one or more corresponding battery condition values; and wherein:

the mobile electronic device data comprises historical battery performance data that comprises historical battery charge data, the historical battery charge data including at least time information and battery charging status information;

the method further comprises using the time information and the battery charging status information to identify one or more battery charge intervals during which the battery was charged;

the historical battery charge data comprises a plurality of historical battery charge data points for each battery charge interval, wherein each historical battery charge data point comprises time information, battery charging current information, and battery charge information;

the time information comprises a relative time value or time stamp;

the battery charging current information comprises a value of charging current supplied to the battery;

the battery charge information comprises a fractional value of the present or actual capacity $Q_{act}$ of the battery, expressed as a fraction or as a percentage of the present or actual capacity $Q_{act}$ of the battery; and wherein the method further comprises:

identifying one or more battery charge ranges within each of the one or more battery charge intervals;

determining, for each battery charge range, an estimate $Q_{act}(k)$ of the present or actual charge capacity $Q_{act}$ of the battery, where k is an index assigned to each battery charge range according to the numerical order in which the fractional values of the present or actual capacity $Q_{act}$ of the battery in the battery charge ranges occur;

estimating the present or actual capacity $Q_{act}$ of the battery by averaging the estimates $Q_{act}(k)$ of the present or actual capacity of the battery for all of the battery charge ranges according to the formula:

$$Q_{act} = \frac{1}{N_k} \sum_{\forall k} Q_{act}(k)$$

where $N_k$ is the total number of battery charge ranges; and determining one or more of the battery condition values based at least in part on the present or actual capacity $Q_{act}$ of the battery.

23. A system comprising the server of claim 22 and a database storing the information relating to each candidate method of the plurality of candidate methods, wherein, when executed by the processing resource of the server, the instructions cause the processing resource of the server to fetch the information relating to each candidate method of the plurality of candidate methods from the database.

\* \* \* \* \*